(12) United States Patent
Meyer Zu Helligen

(10) Patent No.: US 11,497,157 B2
(45) Date of Patent: Nov. 15, 2022

(54) AGRICULTURAL WORK MACHINE

(71) Applicant: CLAAS E-Systems GmbH, Dissen a.T.W. (DE)

(72) Inventor: Lars Peter Meyer Zu Helligen, Spenge (DE)

(73) Assignee: CLAAS E-Systems GmbH, Dissen a.T.W. (DE)

( * ) Notice: Subject to any disclaimer, the term of this patent is extended or adjusted under 35 U.S.C. 154(b) by 455 days.

(21) Appl. No.: 16/690,417

(22) Filed: Nov. 21, 2019

(65) Prior Publication Data
US 2020/0187409 A1    Jun. 18, 2020

(30) Foreign Application Priority Data
Dec. 13, 2018 (DE) .......................... 102018132144.9

(51) Int. Cl.
*A01D 41/12* (2006.01)
*G05D 1/02* (2020.01)
(Continued)

(52) U.S. Cl.
CPC ........ *A01B 79/005* (2013.01); *A01D 41/1217* (2013.01); *G05D 1/021* (2013.01);
(Continued)

(58) Field of Classification Search
CPC ............................ A01B 79/005; A01B 69/008; A01D 41/1217; G05D 1/021; G05D 2201/0201; G06F 16/907; G06F 30/20; G06K 9/6227
See application file for complete search history.

(56) References Cited

U.S. PATENT DOCUMENTS 7,555,283 B2    6/2009  Fitzner et al.
8,204,960 B2    6/2012  Wippersteg et al.
(Continued)

FOREIGN PATENT DOCUMENTS

DE        43 22 293 A1   1/1995
DE    10 2004 043169 A1   3/2006
(Continued)

OTHER PUBLICATIONS

European Search Report dated Apr. 3, 2020 issued in European Application No. 19 20 6116 (with English translation of the relevant parts).

*Primary Examiner* — Frederick M Brushaber
(74) *Attorney, Agent, or Firm* — Lempia Summerfield Katz LLC

(57) ABSTRACT

An agricultural work system for optimizing agricultural work flows has at least one agricultural work unit and a plurality of functional units, each having a control device for controlling the respective functional unit based on a stored set of rules. The agricultural work system has a central pattern recognition system which stores at least one agricultural work situation as a situation pattern. Work situation-specific information is transferrable to the pattern recognition system which identifies a stored work situation and the associated situation pattern based on the obtained information and transmits meta-information (M) characterizing the identified work situation to the functional units. The pattern recognition system and/or the control devices coordinate the cooperation of those functional units which work together in the identified work situation based on the meta-information so that the control devices carry out corresponding parameter adjustments of the associated functional unit.

20 Claims, 3 Drawing Sheets

(51) Int. Cl.
    *G06F 16/907*     (2019.01)
    *G06F 30/20*     (2020.01)
    *G06K 9/62*     (2022.01)
    *A01B 79/00*     (2006.01)

(52) U.S. Cl.
    CPC ............ G06F 16/907 (2019.01); G06F 30/20 (2020.01); G06K 9/6227 (2013.01); *G05D 2201/0201* (2013.01)

(56) References Cited

U.S. PATENT DOCUMENTS

| | | | |
|---|---|---|---|
| 8,213,964 B2 | | 7/2012 | Fitzner et al. |
| 9,538,702 B2 | * | 1/2017 | Balutis ................. G05D 1/0219 |
| 9,795,074 B2 | * | 10/2017 | Stratton ............... A01B 79/005 |
| 10,295,998 B2 | | 5/2019 | Yokoyama |
| 10,598,505 B2 | * | 3/2020 | Sakaguchi .......... G06F 3/04883 |
| 2006/0175541 A1 | * | 8/2006 | Eglington ............ A01B 69/008 |
| | | | 250/221 |

FOREIGN PATENT DOCUMENTS

| | | |
|---|---|---|
| EP | 1619517 A1 | 1/2006 |
| EP | 3 219 184 A1 | 9/2017 |

\* cited by examiner

AGRICULTURAL WORK MACHINE

CROSS-REFERENCE TO RELATED APPLICATIONS

This application claims priority under 35 USC 119 of German Application No. DE102018132144.9, filed on Dec. 13, 2018, the disclosure of which is herein incorporated by reference.

BACKGROUND OF THE INVENTION

The invention is directed to an agricultural work machine and to a method for optimizing agricultural work flows using an agricultural work system.

The agricultural work system described in European Patent Application No. EP 1 619 517 B1 upon which the invention is based has a plurality of agricultural work units which work together with one another in determined work situations. The agricultural work units are agricultural work machines and mounted implements, i.e., mobile agricultural arrangements, and/or stationary agricultural arrangements. An agricultural work machine may be any agricultural work machine that serves to execute an agricultural work order, for example, soil tillage, such as plows, cultivators, harrows or the like. These include traction machines, particularly tractors, but also, in principle, harvesting machines, particularly combine harvesters, forage harvesters or the like. An agricultural work machine of this type has at least one work assembly such as an inclined conveyor, a thresher, a chopping device, a traveling drive, a steering system or the like. Agricultural work machines, particularly in the form of traction machines such as tractors, can also be coupled with a mounted implement which, in this context, likewise forms an agricultural work unit. A mounted implement is, for example, a plow, a cultivator, a harrow, a mower, a baler or the like. Mounted implements of this type also have at least one work assembly, a baler, for example, a crop pickup device, a crop pressing device, etc. Agricultural work units in the form of a stationary agricultural arrangement are, for example, grain drying arrangements, grain stores or the like. Stationary arrangements of this kind also have at least one work assembly, a grain drying arrangement, for example, a grain feeding device and/or transporting device, a heating device, etc.

In the known agricultural work system, each individual agricultural work unit as a whole represents a functional unit for carrying out or supporting agricultural work. Each of the functional units has its own control device for controlling the respective functional unit. The control is carried out based on a stored set of rules. The individual functional units further have their own communications interface which allows a data exchange between those functional units that work together in a determined work situation. The data exchange takes place automatically without the intervention of the operator. In doing so, the individual functional units exchange participant identifications, geographic position data, time windows, traveling speeds, traveling direction information, specific parameters of the respective implemented work flow, or the like, between each other in order to coordinate the cooperation of the functional units. For example, a load transfer process can be coordinated in which a combine harvester forming a functional unit transfers grain from its grain tank into a collecting receptacle of an unloading vehicle, for example, into a transporting trailer coupled with a further agricultural work machine. The unloading vehicle or the unit comprising the further agricultural work machine and transporting trailer forms a further functional unit.

Because of the diversity of cooperation between agricultural work units in connection with a multitude of different mounted implements combined with extensively unknown environmental conditions, satisfactory results in the optimization of agricultural work flows cannot always be achieved with the known agricultural work system. This is true not only for harvesting processes but particularly also when using tractors with mounted implements because an especially large variation between traction machines, mounted implements and types of activity is possible.

SUMMARY OF THE INVENTION

It is therefore an object of the invention to configure and further develop the known agricultural work system in such a way that the cooperation of a plurality of functional units of the agricultural work system is further optimized in the implementation of agricultural work flows.

This object is achieved by an agricultural work system having a plurality of functional units for implementing or supporting agricultural work. As will be explained below, the functional units may be individual agricultural work units but can also be individual work assemblies for implementing or supporting agricultural work within an agricultural work unit. Combinations thereof are also conceivable; that is, at least one functional unit is formed by an agricultural work unit and at least one further functional unit is formed by a work assembly within an agricultural work unit. In a determined work situation, there is always a plurality of functional units working together to implement an agricultural work flow. For example, a plurality of agricultural work units work together with one another, or a plurality of work assemblies within an agricultural work unit work together as functional units.

The term agricultural work unit means a mobile or stationary agricultural arrangement which serves to execute an agricultural work order alone or together with another agricultural work unit. In particular, an agricultural work unit as defined herein is an agricultural work machine, for example, a tractor, a combine harvester, a forage harvester or the like. Mounted implements for coupling with an agricultural machine such as a plow, cultivator, harrow, thresher, baler or the like are also agricultural work units as defined herein. The agricultural units mentioned above are mobile agricultural work units. In principle, however, an agricultural work unit can also be a stationary agricultural arrangement such as a grain drying arrangement, a grain store or the like.

First, a key fundamental consideration consists in that the suggested agricultural work system has a central pattern recognition system to which work situation-specific information is transmitted and which identifies the specific work situation, particularly via a comparison operation and/or computing operation, and conveys it to the functional units of the agricultural work system.

It is a noteworthy fact that the pattern recognition system is a central device which is equally available to all functional units. By "all" functional units is meant all of the functional units, regardless of their suitability and availability, that are data-linked to the pattern recognition system at the time during which the pattern recognition system transmits information about the specific work situation, hereinafter "meta-information", i.e., that are reception-ready and located within reception range. Accordingly, the meta-information is not necessarily transmitted only to the functional units which cooperate with one another in the identified work situation; rather, it can also be provided that the meta-information is obtained by further functional units which serve to carry out other tasks and are therefore unsuitable or which carry out other tasks and are therefore unavailable. Accordingly, to this extent, the pattern recognition system is an overriding information system which collects and processes work situation-specific information centrally. The pattern recognition system, as a central device, also conveys the identified work situation to all functional units.

This communication of the identified work situation (meta-information) which is transmitted to all functional units is preferably limited to the strict indication of the identified work situation and accordingly, in particular, contains no work instructions. Correspondingly, the meta-information preferably comprises no parameters, parameter sets or parameter sequences (parameters changing in temporal succession) for controlling the respective functional unit and/or no references to parameters, parameter sets or parameter sequences stored in the respective functional unit for controlling the respective functional unit. Rather, the functional unit has its own control device and preferably its own stored set of rules which itself generates corresponding parameters, parameter sets or parameter sequences solely on the basis of the obtained designation and/or description of the identified work situation and uses them for controlling the associated functional unit. Accordingly, the meta-information received by the functional unit is preferably merely a trigger which initiates an internal adjustment of parameters in the functional unit. In principle, the meta-information can also additionally contain still further data, which will be explained in more detail in the following.

It is further key that, of all the functional units which obtain the meta-information, the cooperation of those functional units that work together with one another in the identified work situation is coordinated. A coordination is carried out in particular by means of a communication, that is, a data exchange, directly between the respective cooperating functional units, but can also be carried out by means of a communication between the pattern recognition system on the one hand and the respective cooperating functional units on the other hand.

In particular, it is suggested that the agricultural work system has a central pattern recognition system which is configured such that at least one agricultural work situation is stored in the pattern recognition system as situation pattern, work situation-specific information can be sent to the pattern recognition system, the pattern recognition system identifies a stored work situation and the associated situation pattern based on the obtained work situation-specific information and transmits meta-information characterizing the identified work situation to the functional units, and such that the pattern recognition system and/or the control devices of the plurality of functional units is or are configured to coordinate the cooperation of those functional units which work together in the identified work situation based on the meta-information so that the control devices carry out parameter adjustments of the associated functional unit. The cooperation of these functional units is preferably coordinated solely on the basis of the designation and/or description of the identified work situation. Alternatively, however, it can also be provided that the cooperation of the functional units is coordinated by additionally taking into account further data transmitted from the pattern recognition system to all functional units, which will be described in more detail in the following.

The suggested agricultural work system allows for a central situation detection, wherein work situation-specific information can be received from different sources or from different subsystems, and a result of an ensuing pattern recognition process can be fed back to the subsystems in the form of the above-mentioned meta-information. A uniform work situation which can be utilized and/or influenced by all of the subsystems, the so-called functional units, can be determined in this way.

According to one embodiment, the coordination of those functional units which work together in the identified work situation can be carried out by means of the pattern recognition system and/or by means of the functional units themselves, that is, by means of their control devices.

The meta-information particularly preferably contains exclusively data constituting a designation and/or description of the work situation. Additionally, however, according to a further configuration, parameters, parameter sets or parameter sequences and/or references to stored parameters, parameter sets or parameter sequences can also be component parts of the meta-information. These additional data then represent particularly only a recommendation for the respective control device; that is, in this case the control device itself decides whether to take the additional data into account for executing the parameter adjustments. However, it can also be provided that the control device is compelled to take into account the additional data for the execution of parameter adjustments so that the pattern recognition system accordingly has a "master" function to this extent.

Various work situations which be identified by the pattern recognition system, whose designation and/or description can be transmitted to the functional units in the form of meta-information. A work situation of this type can be, for example, the "brush cutting" work situation, the "harvesting along a wheel track in the field" work situation, the "approaching a headland" work situation, the "headland" work situation, the "approaching an obstacle" work situation, the "accompanied travel" work situation, the "load transferring process" work situation, the "grain collection" work situation, the "straw baling" work situation and/or the "straw bale collection" work situation.

Different types of functional units are part of the suggested agricultural work system and obtain the meta-information from the central pattern recognition system, whereupon the functional units then coordinate the cooperation by direct route between each other, or the pattern recognition system coordinates the cooperation between the functional units. Accordingly, the functional units are, in particular, agricultural work units or work assemblies of an agricultural work unit. It is also conceivable in principle that one of the functional units is an agricultural work unit and another one of the functional units is a work assembly, possibly also another agricultural work unit.

According to the particularly preferred configuration, the pattern recognition system can receive the work situation-specific information from sensors of individual agricultural work units or multiple agricultural work units. Particularly preferably, a plurality of agricultural work units, each of which particularly forms a functional unit of the suggested work system, supplies the pattern recognition system with individual or a plurality of work situation-specific information. Additionally or alternatively, input of work situation-specific information on the part of the operator is also conceivable. The pattern recognition system obtains especially exact data about the work situation from many different sources for acquiring work situation-specific information. Correspondingly, the risk of misidentifying a work situation or an associated situation pattern can be minimized. This is all the more successful the more situation-dependent information and the more functional units are available for determining work situation-specific information, particularly via sensors.

The pattern recognition system can have various configurations and functional scopes. In a particularly preferred manner, the pattern recognition system is cloud-based.

The functional units and, in particular, the respective control devices thereof can have various configurations as well. According to a particularly preferred configuration, work situation-specific information which is transmitted to the pattern recognition system contains information from one or more situation levels. Accordingly, work situation-specific information can be determined particularly relating to at least one main work situation, at least one auxiliary work situation, at least one propulsion situation, at least one machine situation, at least one safety situation, at least one automation level, at least one simulation situation and/or at least one load situation. Accordingly, the informational content of the work situation-specific information is preferably structured, and the structure particularly preferably contains basic data, namely, data defining the main work situation, and specific data which, namely, define one or more of the further situation levels.

According to a further preferred configuration, the data exchange between the pattern recognition system and the respective functional unit and/or between functional units takes place in real time. In this context, the term "real time" is to be understood broadly and means that the reception of the data or information takes place within a predetermined period of time after the sending and/or generation of the data, which amounts at most to one half hour, preferably at most a few seconds, for example, at most 30 seconds, particularly preferably at most a few fractions of a second, for example, at most one half second.

According to the likewise preferred configuration, the agricultural work system can be expanded by further functional units such as those described above, that is, it can be constructed modularly.

According to a further teaching, a method is claimed for optimizing agricultural work flows using an agricultural work system, particularly an agricultural work system as suggested. The agricultural work system has a central pattern recognition system in which at least one agricultural work situation is stored as situation pattern, and work situation-specific information is transferred to the pattern recognition system, the pattern recognition system identifies a stored work situation and the associated situation pattern based on the obtained work situation-specific information and transmits meta-information characterizing the identified work situation to the plurality of functional units, and that the pattern recognition system and/or the control devices of the plurality of functional units coordinates or coordinate the cooperation of those functional units working together in the identified work situation based on the meta-information so that the control devices execute corresponding parameter adjustments of the associated functional unit. Reference is made to all of the statements relating to the suggested agricultural work system.

In one embodiment, work situation-specific information is transferred to the pattern recognition system from one or more of the devices for acquiring work situation-specific information, particularly from the work units, the functional units, the sensors, the input devices and/or from further devices, and the pattern recognition system preferably transmits the work situation-specific information or corresponding meta-information back to one or more of these devices, particularly to all of the devices.

BRIEF DESCRIPTION OF THE EMBODIMENTS

The invention will be described in more detail in the following referring to drawings depicting merely exemplary embodiments. In the drawings.

DETAILED DESCRIPTION OF THE EMBODIMENTS

Figure 1:
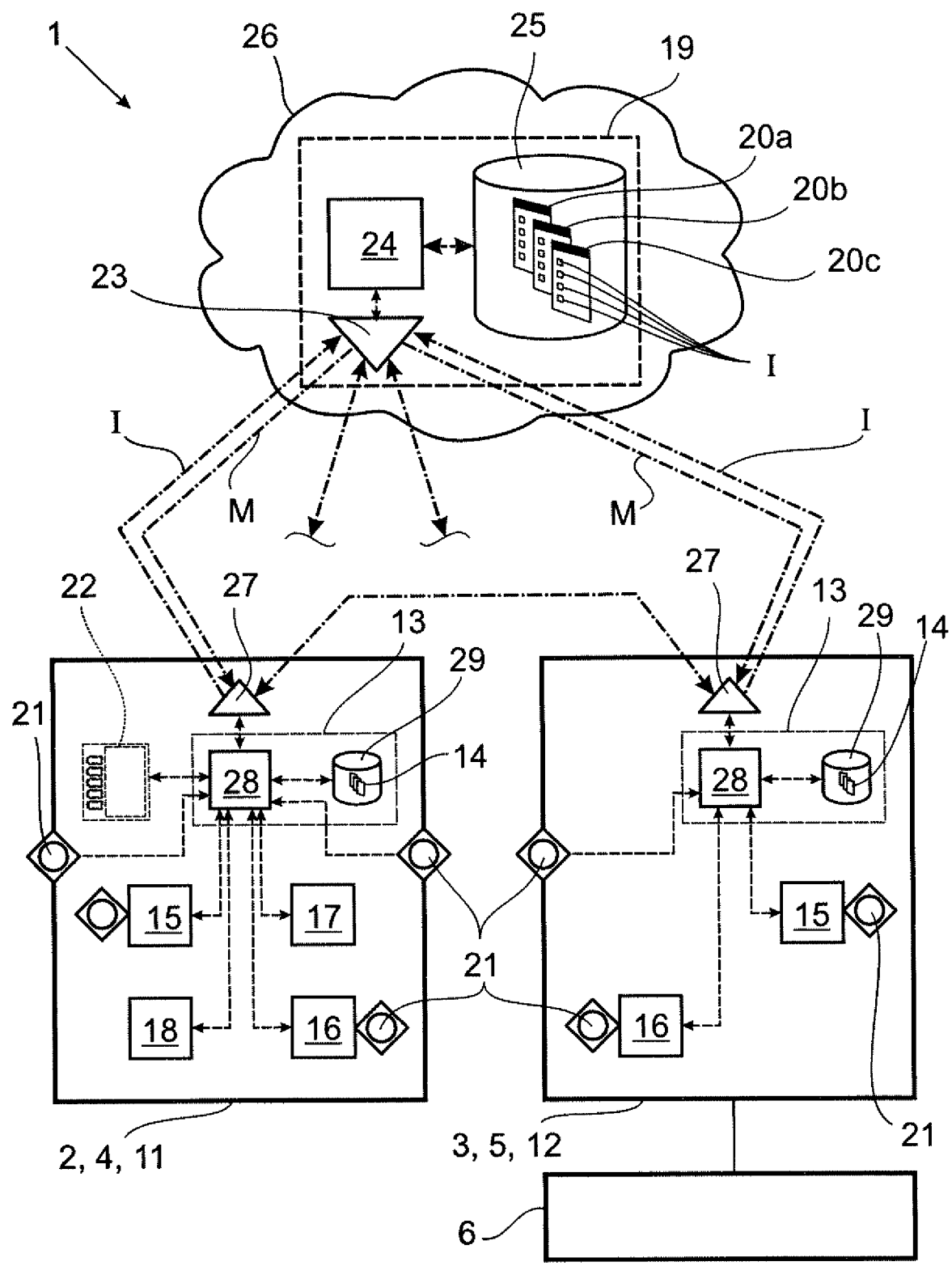
FIG. 1 shows a schematic diagram of a suggested agricultural work situation.

Referring to the drawings, FIG. 1 schematically shows the basic construction of the suggested agricultural work system 1 for optimizing agricultural work flows. Agricultural work system 1 has at least one agricultural work unit 2, 3, in this case two agricultural work units 2, 3. In the example depicted here, the two agricultural work units 2, 3 are agricultural work machines, for example, a combine harvester 4 shown at bottom left in the diagram and, for example, a tractor 5 with a transporting trailer 6 as mounted implement, shown at bottom right in the diagram. Agricultural work unit 2, 3 can also be formed by a mounted implement as such, for example, by a plow, a cultivator, a harrow, a mower, a baler 7 or the like instead of by an agricultural work machine. Additionally or alternatively, an agricultural work unit 2, 3, as meant herein, can also be formed by a stationary agricultural arrangement such as a grain drying arrangement 8, a grain store 9, a workshop area 10 or the like.

The suggested agricultural work system 1 has a plurality of functional units 11, 12 for implementing or supporting agricultural work which have in each instance a control device 13 for controlling the respective functional unit 11, 12, particularly based on a stored set of rules 14. In the depicted embodiment example, the functional units 11, 12 are identical to the agricultural work units 2, 3; that is, one functional unit 11 is formed by combine harvester 4 and the other functional unit 12 is formed by tractor 5. In the present instance and preferably, each functional unit 11, 12 has one or more work assemblies for implementing or supporting agricultural work. As meant herein, work assemblies are in particular a traveling drive 15 of the agricultural work machine, a steering system 16 of the agricultural work machine, a crop-processing work assembly such as a cutter 17, a thresher and/or a load transferring device 18 or a driver assistance system of the agricultural work machine which, in particular, controls a plurality of work assemblies during the agricultural work flows and, in particular, also comprises control device 13.

In an alternative embodiment example, not shown, the mounted implement can also have work assemblies. For example, a baler can have a crop pickup device and a crop pressing device. A stationary agricultural arrangement can also have work assemblies as functional unit. For example, a grain drying arrangement can have a grain feeding device and a heating device.

The suggested agricultural work system 1 further has a central pattern recognition system 19. At least one agricultural work situation is stored as a situation pattern 20a, 20b, 20c in pattern recognition system 19. In this case, for example, three different situation patterns 20a, 20b, 20c are stored, each of these situation patterns 20a, 20b, 20c representing a different work situation. As meant herein, a work situation is a particular situation in which a determined agricultural work flow is to be carried out as part of a work order. In a merely exemplary manner and not exhaustively, this includes the work situation during brush cutting, the work situation when harvesting along a wheel track in the field, the work situation when approaching a headland, the work situation in the headland, the work situation when approaching an obstacle, the work situation during accompanied travel, for example, for the purpose of load transfer, the work situation during the load transferring process, the work situation during grain collection, the work situation during straw baling, or the work situation during straw bale collection. Each of these work situations requires a determined work sequence which in turn requires parameter adjustments of one or more work assemblies of an agricultural work unit 2, 3, for example, of an agricultural work machine. In an exemplary and purely schematic manner, FIG. 1 shows a load transferring process in which a combine harvester 4 as one functional unit 11 follows closely alongside a tractor 5 forming a further functional unit 12 and is coupled with a transporting trailer 6 as a mounted implement for pickup of the grain by combine harvester 4. In this work situation, for example, the respective control device 13 must control the respective traveling drive 15 and the respective steering system 16. The driving movements of the two traveling drives 15 and the steering movements of the two steering systems 16 must be coordinated. Further, in the functional unit 11 formed by the combine harvester 4, the cutter 17 and load transferring device 18, inter alia, must be controlled. The movements of these two devices 17, 18 must also be coordinated.

In order to optimize the required work flow of the two agricultural work units 2, 3, i.e., in this instance combine harvester 4 and tractor 5, a plurality of, particularly multiple, work situation-specific information I is transferred to pattern recognition system 19. The work situation-specific information I is information or data which are related to the impending and/or present work situation and/or which are suitable for defining the impending and/or present work situation. In the present instance and preferably, the work situation-specific information I is determined by the functional units 11, 12 themselves, possibly also additionally by further functional units of agricultural work system 1, and is transferred to pattern recognition system 19.

Pattern recognition system 19 is configured such that it identifies a stored work situation and the associated situation pattern 20a, 20b, 20c based on the obtained work situation-specific information I. In particular, pattern recognition system 19 matches the individual obtained data with the stored situation patterns 20a, 20b, 20c. If a matching situation pattern 20a, 20b, 20c has been identified based on the data, pattern recognition system 19 transmits meta-information M characterizing the identified work situation to the plurality of functional units 11, 12. The meta-information M is a communication about the identified work situation which, in the present instance and preferably, is limited to the strict indication of the identified work situation in the form of the designation or a description of the work situation and accordingly in particular contains no work instructions. Correspondingly, the meta-information preferably includes no parameters, parameter sets or parameter sequences (parameters changing in temporal succession) for controlling the respective functional unit and/or no references to parameters, parameter sets or parameter sequences stored in the respective functional unit for controlling the respective functional unit. Rather, in the present instance and preferably, the functional units 11, 12 must themselves generate corresponding parameters, parameter sets or parameter sequences for the identified work situation based on the communicated work situation, i.e., the meta-information M, and carry out corresponding parameter adjustments.

In an alternative embodiment example, not shown, it can also be provided that the meta-information M also contains—in addition to the data comprising a designation and/or description of the work situation—parameters, parameter sets or parameter sequences for controlling the respective functional unit 11, 12 and/or references to parameters, parameter sets or parameter sequences for controlling the respective functional unit 11, 12 that are stored in the respective functional unit 11, 12.

The meta-information M contains particularly data which comprise a designation and/or description of the "brush cutting" work situation, the "harvesting along a wheel track in the field" work situation, the "approaching a headland" work situation, the "headland" work situation, the "approaching an obstacle" work situation, the "accompanied travel" work situation, the "load transferring process" work situation, the "grain collection" work situation, the "straw baling" work situation and/or the "straw bale collection" work situation.

It should be emphasized that the meta-information M which is generated and conveyed by pattern recognition system 19 is not compulsorily conveyed only to the two functional units 11, 12 working together with one another in the respective work situation, but rather can also be conveyed to other functional units of the agricultural work system 1, which is symbolized in FIG. 1 by two arrows which proceed from pattern recognition system 19 and do not lead to any of the functional units shown. All of the functional units of the agricultural work system 1 detect, particularly independently, whether or not the received meta-information M applies to them. The respective control device 13 responds only in case the meta-information M relates to it, as is the case here with functional units 11, 12.

To this end, in the present instance and preferably, control devices 13 of the plurality of functional units 11, 12 are configured to coordinate the cooperation of those functional units 11, 12 that work together in the identified work situation based on the meta-information M. In the course of this coordination, control devices 13 carry out corresponding parameter adjustments of the associated functional unit 11, 12. Accordingly, in the present instance and preferably, the meta-information M is a trigger which activates control devices 13 so that the latter generate parameters, parameter sets and/or parameter sequences and carry out corresponding parameter adjustments. Additionally or alternatively, pattern protection system 19 can be configured to coordinate the cooperation of those functional units 11, 12 working together in the identified work situation based on the meta-information M. In this case also, control devices 13 carry out corresponding parameter adjustments of the associated functional unit 11, 12.

As mentioned previously, functional units 11, 12 can be formed by different agricultural work units 2, 3. Accordingly, functional units 11, 12 are, for example, an agricultural work machine, a mounted implement which is coupled or coupleable with an agricultural work machine, and/or a stationary agricultural arrangement. In an alternative embodiment, not shown, functional units 11, 12 can also be formed by different work assemblies of an agricultural work unit 2, 3. For example, a functional unit 11, 12 can be a traveling drive 15 of the agricultural work machine, a steering system 16 of the agricultural work machine, a driver assistance system of the agricultural work machine, a crop-processing work assembly of the agricultural work machine or of the stationary agricultural arrangement and/or a crop-processing work assembly of the mounted implement.

In the present instance and preferably, pattern recognition system 19 is configured to receive individual or a plurality of work situation-specific information I from sensors 21 of the at least one agricultural work unit 2, 3 or of the plurality of agricultural work units 2, 3. In this case, it can further be optionally provided that work situation-specific information I can be entered by the operator via an input device 22 of the agricultural work unit 2, 3, which work situation-specific information I is likewise received by pattern recognition system 19.

In the present instance and preferably, pattern recognition system 19 has a communications interface 23 for receiving the work situation-specific information I and for conveying the meta-information M to functional units 11, 12. Further, pattern recognition system 19 has a computer 24 for processing the individual received work situation-specific information I and a data storage 25 in which the situation patterns 20a, 20b, 20c are stored. In the present instance and preferably, computer 24 and data storage 25 are a component part of a cloud 26, that is, are provided via the Internet. Accordingly, pattern recognition system 19 is preferably partially or completely cloud-based. However, it is also conceivable to provide this in association with a machine, that is, in an agricultural work machine, and/or in a stationary manner, that is, in a localized manner, for example, in a data processing installation on an agricultural operation.

Functional units 11, 12 also preferably have in each instance a communications interface 27. This serves in every case to receive meta-information M. Further, communications interface 27 can also be configured to transmit work situation-specific information I. In the present instance and preferably, communications interface 27 is further configured to exchange data with a communications interface 27 of another functional unit 11, 12 so that it is possible to coordinate the cooperation by direct route.

In the present instance and preferably, control devices 13 of functional units 11, 12 have in each instance a microcontroller 28 for processing the respective meta-information M and a data storage 29 in which the set of rules 14 is stored. The set of rules 14 can have parameters, parameter sets and/or parameter sequences for at least one work assembly of agricultural work unit 2, 3 which are associated respectively with different work situations. The respective control device 13 can then adjust at least one parameter, at least one parameter set and/or at least one parameter sequence for at least one work assembly of agricultural work unit 2, 3 based on the obtained meta-information M and coordinate the at least one adjustment with at least one adjustment of another functional unit 11, 12 based on the same meta-information M.

The work situation-specific information I is preferably structured and contains work situation-specific information I from one or more hierarchically distinct situation levels E, $E_0$, $E_1$, etc. Accordingly, work situation-specific information I can be determined relating to at least one main work situation, at least one auxiliary work situation, at least one propulsion situation, at least one machine situation, at least one safety situation, at least one automation level, at least one simulation situation and/or at least one load situation and can be conveyed to pattern recognition system 19.

Work situation-specific information I relating to a main work situation or to a work situation of a main situation level $E_0$ can contain at least work situation-specific information I for defining the preparation of a work order and/or for defining the environment (e.g., road, field) and/or for defining the work order (e.g., grain harvesting, soil tillage, etc.) of the agricultural work unit or of another, particularly adjacent, agricultural work unit.

Work situation-specific information I relating to an auxiliary work situation or to a work situation of a subordinate auxiliary situation level $E_1$ can contain at least work situation-specific information I for defining a subordinate task (e.g., brush cutting, harvesting along a wheel track in the field, approaching a headland, traversing a headland, approaching an obstacle, accompanied travel, load transferring process, grain collection, straw baling, straw bale collection) of the agricultural work unit or of another, particularly adjacent, agricultural work unit.

Work situation-specific information I relating to a propulsion situation or to a work situation of a further subordinate situation level can contain at least work situation-specific information I for defining a movement state and/or traveling state (e.g., standstill, stationary, forward, reverse) of the agricultural work unit or of another, particularly adjacent, agricultural work unit.

Work situation-specific information I relating to a machine situation or to a work situation of another subordinate situation level $E_1$ can contain at least work situation-specific information I for defining a machine state (e.g., main assembly "on", main assembly "off") of the agricultural work unit or of another, particularly adjacent, agricultural work unit.

Work situation-specific information I relating to a safety situation or to a work situation of another subordinate situation level can contain at least work situation-specific information I for defining the functional safety of the agricultural work unit or of another, particularly adjacent, agricultural work unit.

Work situation-specific information I relating to an automatic level or to a work situation of another subordinate situation level can contain at least work situation-specific information I for defining an adjusted driving mode or driving mode level (Level 1: internal automation, Level 2: automatic cutter control, Level 3: automatic field travel, Level 4: remote-controlled field travel, Level 5: autonomous field travel, Level 6: automatic road travel) of the agricultural work unit or of another, particularly adjacent, agricultural work unit.

Work situation-specific information I relating to a simulation situation or to a work situation of another subordinate situation level can contain at least work situation-specific information I for defining a simulation of a work order.

Work situation-specific information I relating to a load situation or to a work situation of another subordinate situation level can contain at least work situation-specific information I for defining a load state (e.g., capacity used up, full capacity available) of the agricultural work unit or of another, particularly adjacent, agricultural work unit.

The data exchange between pattern recognition system 19 and the respective functional unit 11, 12 and/or the data exchange between functional units 11, 12 is carried out in the present instance and preferably in real time. Particularly preferably, the data exchange is carried out wirelessly.

In the present instance and preferably, the suggested agricultural work system 1 is expandable modularly by further functional units (not shown) for implementing or supporting agricultural work. Each of the further functional units can correspond to the functional units 11, 12 described above with respect to construction and manner of functioning.

Figure 2:
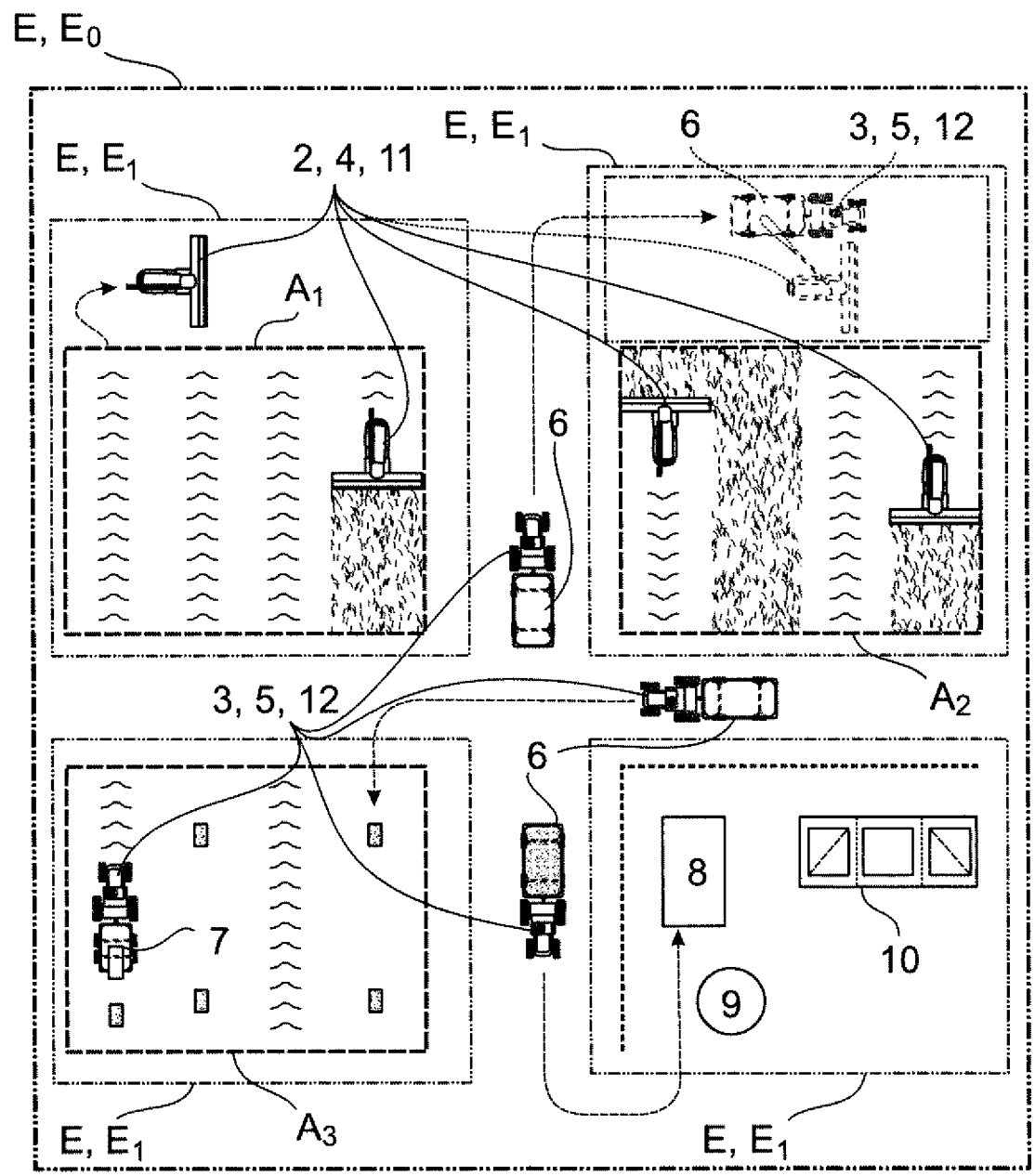
FIG. 2 shows a schematic diagram showing cases of use of the suggested agricultural work situation.

FIG. 2 shows the suggested agricultural work system 1 for the agricultural case of use of grain harvesting and the corresponding subordinate tasks such as harvesting along a wheel track in the field, the load transferring process, grain collection in the operation yard and straw baling.

An agricultural operation having a workshop area 10 in addition to a grain drying arrangement 8 and a grain store 9 is shown schematically at lower right in FIG. 2. The agricultural operation, as such, and its stationary structural units comprising grain drying arrangement 8, grain store 9 and workshop area 10 form stationary functional units 11, 12 of the suggested agricultural work system 1.

The agricultural operation is connected to a plurality of lands to be processed, in this case crop areas $A_1$, $A_2$, $A_3$, by a network of roads and paths of any configuration.

Two agricultural work machines constructed as combine harvesters 4 are in use for harvesting on a first crop area $A_1$. One combine harvester 4 passes through the field crop and a further combine harvester 4 travels through the headland. The two combine harvesters 4 form further functional units 11, 12, in this case mobile functional units 11, 12, of the suggested agricultural work system 1. The combine harvesters 4 store the harvested fructification parts, in this case cereal grain, in a tank associated with the machine in a conventional manner, per se, until a load transferring process, while the straw generated by the harvesting process is put down as swath on crop area $A_1$ in the rear area of the combine harvester 4.

Two further agricultural work machines constructed as combine harvesters 4 perform harvesting work in a similar manner on a further crop area $A_2$, for example, simultaneously or at different times. These two combine harvesters 4 form further functional units 11, 12, in this case mobile functional units 11, 12, of the suggested agricultural work system 1. Accordingly, the depicted processing of agricultural crop areas $A_1$, $A_2$ reflects a typical use of combine harvesters 4 in harvesting, since in the case of large parcels of land $A_1$, $A_2$ a plurality of agricultural work machines generally execute an agricultural work order jointly for reasons of economy. A possible load transferring process between one of the combine harvesters 4 and a tractor 5 and transporting trailer 6 working in tandem is depicted in FIG. 2 above crop area $A_2$.

A further crop area $A_3$ is shown on which, for example, simultaneously or at different times, a baler 7 drawn by a tractor 5 presses the crop put down in swaths into bales of crop. The tractor 5 forms a further functional unit 11, 12, in this case a mobile functional unit 11, 12, of the suggested agricultural work system 1.

Finally, further tractors 5 and transporting trailers 6 acting in tandem are depicted traveling along the network of roads and paths with the aim of loading and unloading the grain. The tractor 5 and transporting trailer 6 are empty in two cases and full in one case. Each of these tractors 5 forms a further functional unit 11, 12, in this case a mobile functional unit 11, 12, of the suggested agricultural work system 1.

Each of the situations mentioned above which are shown schematically in FIG. 2 represents an agricultural work situation within the meaning of the present application. Each of these work situations corresponds to a situation pattern 20a, 20b, 20c which is stored in the central pattern recognition system 19 and which can be identified by pattern recognition system 19 based on received work situation-specific information I. Following the identification of a determined situation pattern 20a, 20b, 20c and in accordance with an identified work situation, the pattern recognition system 19 transmits meta-information M characterizing the identified work situation to the functional units 11, 12 shown in FIG. 2 in the manner described above.

For example, the transfer of grain to the grain drying arrangement 8 is identified ("grain collection" situation pattern) as work situation for the agricultural operation. The harvesting of a field, in this instance a grain field, along wheel tracks ("harvesting along a wheel track in the field" situation pattern) is identified, for example, as work situation for the first crop area $A_1$. The transfer of harvested fructification parts, in this instance cereal grain, is identified ("load transferring process" situation pattern), for example, as work situation for the second crop area $A_2$. The pressing of bales, in this instance round bales, is identified ("straw baling" situation pattern), for example, as work situation for the third crop area $A_3$.

As has already been mentioned, the work situation-specific information I which is transmitted to pattern recognition system 19, contains particularly information from a plurality of situation levels E, $E_0$, $E_1$, etc. Work situation-specific information I contains, for example, at least information relating to a main work situation and an auxiliary work situation. In this instance, a subordinate, global "grain harvest" situation pattern, for example, is associated with a main work situation. In this instance, merely by way of example and not exclusively, the "harvesting along a wheel track in the field", "load transferring process", "grain collection" and "straw baling" situation patterns are associated with an auxiliary work situation in pattern recognition system 19.

All of the functional units 11, 12 shown in FIG. 2 and the control units 13 thereof are configured in this instance and preferably in such a way that the control devices 13 of those functional units 11, 12 which work together in the identified work situation coordinate their cooperation based on the obtained meta-information M and execute parameter adjustments of the associated functional unit 11, 12.

For example, parameter adjustments of traveling drive 15 and of steering system 16, inter alia, are carried out by the control devices 13 of every functional unit 11, 12 based on the "load transferring process" situation pattern so that combine harvester 4 and tractor 5 meet one another at an optimal time in optimal orientation. The rest of the functional units 11, 12 also obtain the meta-information M but detect independently that they are in a different work situation and accordingly do not react to the meta-information M.

In a further embodiment example, the operator specifies the "brush cutting" work situation via the input device 22 of a first work unit 2, 3 configured as combine harvester as work situation-specific information I. This work situation-specific information I is then transferred to pattern recognition system 19 which subsequently identifies the stored "brush cutting" work situation and the associated situation pattern 20a, 20b, 20c based on the obtained work situation-specific information I. Pattern recognition system 19 generates and then transmits meta-information M characterizing the identified "brush cutting" work situation to all of the further work units 2, 3 of the agricultural work system 1 which form a functional unit 11, 12 in each instance, including in particular at least one further combine harvester and at least one unloading vehicle.

The cooperation of the work units 2, 3 working together in the "brush cutting" work situation is coordinated based on the meta-information M in that parameter adjustments specifically provided for the "brush cutting" work situation are carried out in the first work unit 2, 3 formed as combine harvester, and/or in that a further combine harvester is requested as further work unit 2, 3 for the "brush cutting" work situation, and/or in that an unloading vehicle is requested as further work unit 2, 3 for a "load transferring process" work situation following the "brush cutting" work situation.

As has already been mentioned, the suggested agricultural work system is generally configured in such a way that individual or a plurality of work situation-specific information I is transferred to pattern recognition system 19 from one or more devices for acquiring work situation-specific information I. In a particularly preferred manner, the work situation-specific information I is transferred to pattern recognition system 19 from one or more work units 2, 3, from one or more functional units 11, 12, from one or more sensors 21 of at least one of the work units 2, 3, from one or more input devices 22 for operator input of work situation-specific information I, and/or from one or more further devices for acquiring work situation-specific information I. In the present instance and preferably, pattern recognition system 19 transmits the transferred work situation-specific information I and/or the meta-information M generated based on the latter by pattern recognition system 19 back to one or more of these devices, particularly all of these devices.

Figure 3:
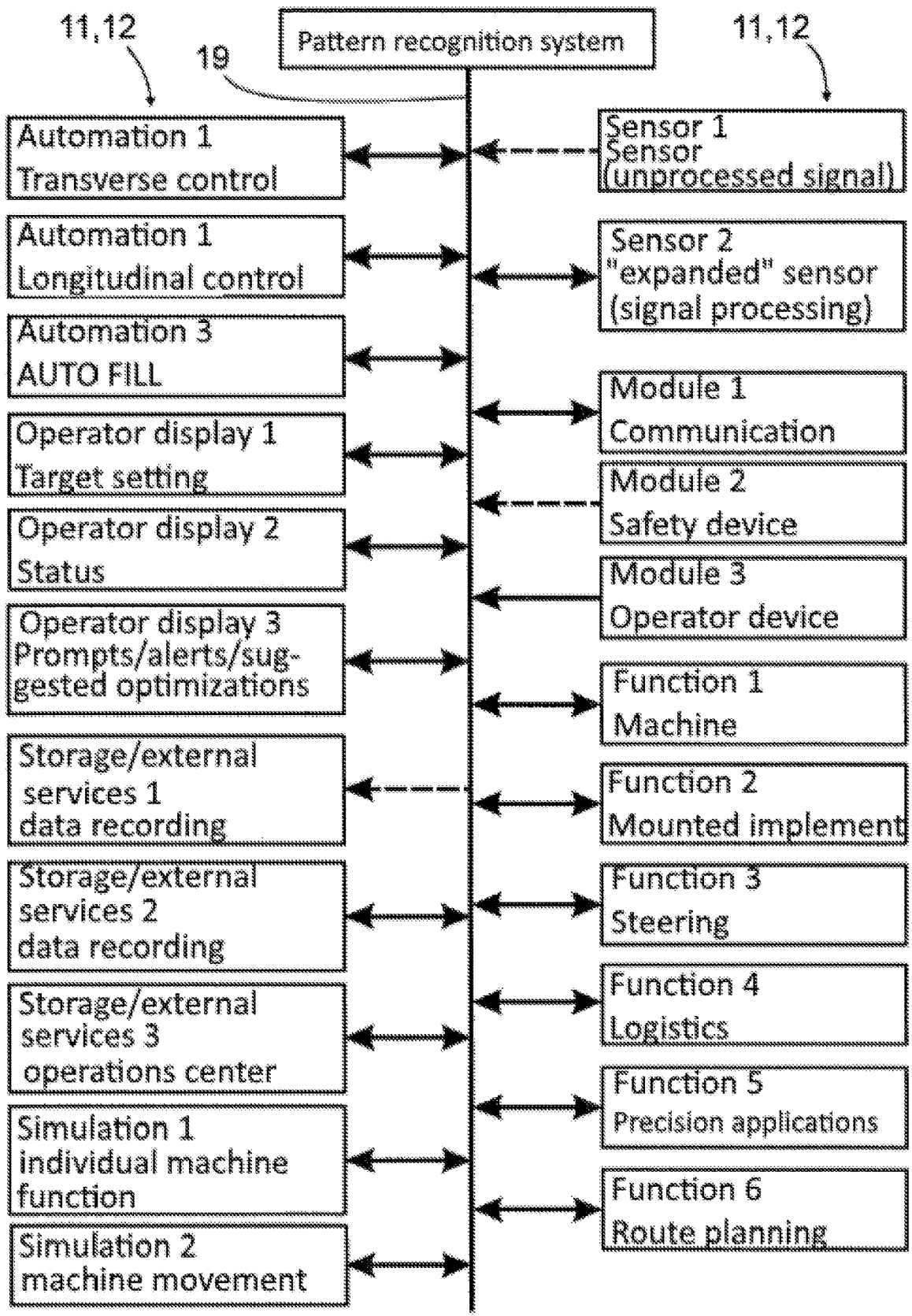
FIG. 3 shows a schematic depiction of the communication between the pattern recognition system and individual functional units of the suggested agricultural work system.

Finally, FIG. 3 schematically shows the communication between pattern recognition system 19 and individual functional units 11, 12 of the suggested agricultural work system 1. The communication is bidirectional (indicated by a double arrow) in some functional units 11, 12, i.e., is carried out in both directions between pattern recognition system 19 and functional unit 11, 12. In other functional units 11, 12, the communication is unidirectional (indicated by a single arrow), i.e., is carried out either only from pattern recognition system 19 to functional unit 11, 12 or only from functional unit 11, 12 to pattern recognition system 19. Optional communication paths are shown in dashed lines.

Shown on the left-hand side as functional units 11, 12 by way of example are, from top to bottom, a transverse control unit, a longitudinal control unit, an "autofill" control unit, an operator display for displaying a target setting, an operator display for displaying status, an operator display for displaying prompts, alerts, and/or optimization suggestions, an (optional) storage or external services for data recording, a storage or external services for data analysis, a storage or external services as operations center, a simulation unit for simulating individual machine functions, and a simulation unit for simulating machine movements.

Shown on the right-hand side as further functional units 11, 12 by way of example are, from top to bottom, a sensor unit with at least one sensor for generating unprocessed signals, a sensor unit with at least one expanded sensor with signal processing, a module for communications, a module in the form of an operator device, a function module in the form of the machine, a function module in the form of the mounted implement, a function module in the form of a steering module, a function module in the form of a logistics module, a function module in the form of an optimization module (precision applications), for example, in the form of an automatic swath controller (section control) or in the form of a variable application rate control (variable rate control), and a functional module in the form of a route planning module.

REFERENCE CHARACTERS 1 agricultural work system
2 agricultural work unit
3 agricultural work unit
4 combine harvester
5 tractor
6 transporting trailer
7 baler
8 grain drying arrangement
9 grain store
10 workshop area
11 functional unit
12 functional unit
13 control device
14 set of rules
15 traveling drive
16 steering system
17 cutter
18 load transferring device
19 pattern recognition system
20a, 20b, 20c situation pattern
21 sensor
22 input device
23 communications interface
24 computer
25 data storage
26 cloud
27 communications interface
28 microcontroller
29 data storage
$A_1, A_2, A_3$ crop areas
I work situation-specific information
M meta-information
$E, E_0, E_1$ situation levels

What is claimed is:

1. An agricultural work system for optimizing agricultural work flows, the agricultural work system comprising:
    at least one agricultural work unit in a form of an agricultural work machine or a stationary agricultural arrangement,
    a plurality of functional units configured for implementing or supporting agricultural work, each respective functional unit of the plurality of functional units having a control device for controlling the respective functional unit based on a stored set of rules, and
    a central pattern recognition system, separate from and in communication with the plurality of functional units, that is configured such that a plurality of agricultural work situations are stored in the central pattern recognition system as respective situation patterns,
    wherein at least one of the plurality of functional units comprises at least one of an agricultural work machine, a mounted implement which is coupled or coupleable with the agricultural work machine, or the stationary agricultural arrangement,
    wherein the central pattern recognition system is configured to:
        receive work situation-specific information;
        identify, based on the work situation-specific information, a stored work situation that is stored and an associated situation pattern; and
        transmit meta-information characterizing the work situation to the respective functional units, and
    wherein the control devices perform parameter adjustments of the functional units based on the meta-information by one or both of:
        the central pattern recognition system coordinating cooperation with the respective functional units; or the control devices of the respective functional units coordinating cooperation of the respective functional units.

2. The agricultural work system according to claim 1, wherein the pattern recognition system is configured to coordinate the cooperation of the respective functional units which work together in the identified work situation based on the meta-information, and the control devices of the respective functional units are configured to perform corresponding parameter adjustments of the respective functional units.

3. The agricultural work system according to claim 1, wherein the meta-information contains data constituting one or both of a designation or description of the work situation, or
wherein that the meta-information contains, in addition to data constituting one or both of the designation or the description of the work situation, parameters, parameter sets or parameter sequences for controlling the respective functional unit and/or references to parameters, parameter sets or parameter sequences stored in the respective functional unit for controlling the respective functional unit.

4. The agricultural work system according to claim 1, wherein the central pattern recognition system is configured to receive individual or a plurality of work situation-specific information from sensors of the at least one agricultural work unit, and/or to receive work situation-specific information entered by an operator via an input device of the at least one agricultural work unit.

5. The agricultural work system according to claim 1, wherein the central pattern recognition system is one or both of:
partially or completely cloud-based or
one or both of provided in a separate machine or in a stationary manner.

6. The agricultural work system according to claim 1, wherein the control devices of the functional units each have a microcontroller configured for processing respective meta-information received from the central pattern recognition system and a data storage in which the stored set of rules is stored.

7. The agricultural work system according to claim 1, wherein the stored set of rules has parameters, parameter sets and/or parameter sequences for at least one work assembly of the at least one agricultural work unit which are associated respectively with different work situations,
wherein a respective control device is configured to adjust at least one of at least one parameter, at least one parameter set or at least one parameter sequence for at least one work assembly of the at least one agricultural work unit based on the meta-information received from the central pattern recognition system and to coordinate the at least one adjustment with at least one adjustment of another functional unit based on same meta-information received from the central pattern recognition system.

8. The agricultural work system according to claim 1, wherein the work situation-specific information contains the work situation-specific information from one or more situation levels, and
wherein the work situation-specific information contains, respectively, at least information relating to at least one main work situation, at least one auxiliary work situation, at least one propulsion situation, at least one machine situation, at least one safety situation, at least one automatic level, at least one simulation situation and/or at least one load situation.

9. The agricultural work system according to claim 1, wherein the agricultural work system comprises further functional units for implementing or supporting agricultural work, the further functional units each having the control device for controlling respective functional units based on a stored set of rules and being configured in such a way that the further functional units are configured to receive meta-information characterizing a work situation identified by the central pattern recognition system and such that the control device of the respective further functional unit and the control device of another functional unit which works together with the respective further functional unit in the work situation identified by the central pattern recognition system coordinate cooperation of the control device of the respective further functional unit and the control device of the another functional unit based on the meta-information from the central pattern recognition system and perform parameter adjustments of the functional unit associated with the control device of the respective functional unit and of the functional unit associated with the control device of the another functional unit.

10. The agricultural work system according to claim 1, wherein the control devices of the plurality of functional units which work together in the identified work situation are configured to coordinate cooperation of the plurality of functional units with one another based on the meta-information and perform parameter adjustments of an associated functional unit.

11. The agricultural work system according to claim 1, wherein a first agricultural work machine includes a first functional unit;
wherein a second agricultural work machine includes a second functional unit;
wherein the first agricultural work machine is independently movable from the second agricultural work machine; and
wherein the control device of the first functional unit and the control device of the second functional unit coordinate cooperation by communicating between the first agricultural work machine and the second agricultural work machine.

12. The agricultural work system according to claim 11, wherein the first agricultural work machine is a first type of agricultural work machine;
wherein the second agricultural work machine is a second type of agricultural work machine; and
wherein the first type of agricultural work machine is different from the second type of agricultural work machine.

13. The agricultural work system according to claim 11, wherein the first agricultural work machine comprises a combine;
wherein the second agricultural work machine comprises a tractor;
wherein the combine is configured to perform a first task on a field; and
wherein the tractor is configured to perform a second task on the field different from the first task.

14. The agricultural work system according to claim 11, wherein the first agricultural work machine and the second agricultural work machine are of a same type of agricultural work machine.

15. The agricultural work system according to claim 14, wherein the first agricultural work machine comprises a first combine;

wherein the second agricultural work machine comprises a second combine;

wherein the first combine and the second combine are configured to work in combination on a same field.

16. The agricultural work system according to claim 15, wherein both the first combine and the second combine are configured to coordinate with each passing through the same field.

17. The agricultural work system according to claim 15, wherein both the first combine and the second combine are configured to coordinate with the first combine passing through the same field and with the second combine passing through a headland of the same field.

18. The agricultural work system according to claim 1, wherein the central pattern recognition system is configured to obtain the work situation-specific information from a plurality of different sources.

19. A method for optimizing agricultural work flows using an agricultural work system having least one agricultural work unit in a form of an agricultural work machine or a stationary agricultural arrangement, wherein the agricultural work system has a plurality of functional units for implementing or supporting agricultural work, each of which functional units has a control device for controlling a respective functional unit based on a stored set of rules, the method comprising:

storing at least one agricultural work situation as a situation pattern in a central pattern recognition system, transferring work situation-specific information to the central pattern recognition system, accessing work situation-specific information, identifying, with the central pattern recognition system and using the work situation-specific information, a stored work situation and an associated situation pattern, transmitting meta-information characterizing the work situation identified with the central pattern recognition system to the plurality of functional units, and coordinating via one or both of the central pattern recognition system or the control devices of the plurality of functional units, cooperation of the functional units which work together in the identified work situation based on the meta-information, so that the control devices perform corresponding parameter adjustments of an associated functional unit.

20. The method according to claim 19, wherein the work situation-specific information is transferred to the central pattern recognition system from one or more devices comprising one or more agricultural work units, one or more of the functional units, one or more sensors of the one or more agricultural work units, one or more input devices for operator input of the work situation-specific information, and/or one or more further devices for acquiring the work situation-specific information, and wherein the central pattern recognition system transmits one or both of the work situation-specific information or meta-information generated based on the work situation-specific information by the central pattern recognition system back to the one or more devices.

* * * * *